United States Patent
Miyazaki

(10) Patent No.: US 7,276,944 B2
(45) Date of Patent: Oct. 2, 2007

(54) CLOCK GENERATION CIRCUIT AND CLOCK GENERATION METHOD

(75) Inventor: Yukisato Miyazaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/312,392

(22) Filed: Dec. 21, 2005

(65) Prior Publication Data

US 2007/0057709 A1 Mar. 15, 2007

(30) Foreign Application Priority Data

Sep. 15, 2005 (JP) ............... 2005-268332

(51) Int. Cl.
*H03L 7/06* (2006.01)
(52) U.S. Cl. ..................... 327/156; 327/158
(58) Field of Classification Search ............... 327/149, 327/153, 156, 158 X, 161, 158; 326/39; 331/1 R, 17, 25; 375/373–376; 365/233
See application file for complete search history.

(56) References Cited

U.S. PATENT DOCUMENTS 6,043,677 A * 3/2000 Albu et al. ................ 326/39
7,158,443 B2 * 1/2007 Lin ............................ 365/233

2004/0257124 A1 12/2004 Araki et al. ............... 327/101
2005/0134335 A1 6/2005 Loh ........................... 327/156

FOREIGN PATENT DOCUMENTS

| EP | 1 571 530 A1 | 9/2005 |
| JP | 07-202652 | 8/1995 |
| JP | 07-235862 | 9/1995 |
| JP | 2005-004451 | 1/2005 |
| JP | 2005-020083 | 1/2005 |

* cited by examiner

*Primary Examiner*—Linh My Nguyen
(74) *Attorney, Agent, or Firm*—Arent Fox LLP

(57) ABSTRACT

A clock generation circuit and a clock generation method are provided, which are spread spectrum clock generation and accurate phase control of a reference clock signal and an output clock signal. An input divider unit 70 divides an input clock signal CLKR by 50 to output a divided input clock signal CLKS. A DLL circuit 80 operates to obtain delay control signals DCS1, DCS2. A modulation circuit 40 modulates, in response to the delay control signals DCS1, DCS2 and a modulation signal MOD output from a modulation control circuit 50, the divided input clock signal CLKS to output a modulation clock signal CLKN. A phase comparator 11 detects the phase difference between the modulation clock signal CLKN and a divided inner clock signal CLKM. A clock generation unit 20 generates an output clock signal CLKO having frequency corresponding to a phase difference signal from the phase comparator 11.

8 Claims, 8 Drawing Sheets

CIRCUIT BLOCK DIAGRAM OF A SPREAD SPECTRUM CLOCK GENERATION CIRCUIT 1

FIG. 1 CIRCUIT BLOCK DIAGRAM OF A SPREAD SPECTRUM CLOCK GENERATION CIRCUIT 1

FIG. 2 CIRCUIT DIAGRAM OF A DLL CIRCUIT 80

FIG. 3 CIRCUIT DIAGRAM OF A MODULATION CIRCUIT 40

FIG. 4 TIME CHART OF THE MODULATION CIRCUIT 40

FIG. 5 WAVEFORM CHART OF STEPS S1 TO S4

FIG. 6 WAVEFORM CHART OF STEPS S5 TO S8

FIG. 7

CORRELATION TABLE OF A RELOAD VALUE CR, A MODULATION SIGNAL MOD AND A CYCLE TN

| STEP | S1 | S2 | S3 | S4 | S5 | S6 | S7 | S8 | S9 | S10 | S11 | S12 | S13 | S14 | S15 | S16 | S17 | S18 | S19 | S20 |
|---|---|---|---|---|---|---|---|---|---|---|---|---|---|---|---|---|---|---|---|---|
| RELOAD VALUE CR | 100 | 100 | 100 | 101 | 101 | 101 | 100 | 101 | 100 | 101 | 100 | 99 | 100 | 99 | 100 | 99 | 99 | 99 | 100 | 100 |
| MODULATION SIGNAL MOD | 0 | 1 | 3 | 1 | 0 | 0 | 4 | 2 | 4 | 0 | 0 | 4 | 2 | 4 | 0 | 0 | 1 | 3 | 1 | 0 |
| CYCLE T1 | 2500 | 2500 | 2500 | 2525 | 2525 | 2525 | 2500 | 2525 | 2500 | 2525 | 2500 | 2475 | 2500 | 2475 | 2500 | 2475 | 2475 | 2475 | 2500 | 2500 |
| MODULATION WIDTH MW | 0 | 5 | 10 | -10 | -5 | 0 | 20 | -10 | 10 | -20 | 0 | 20 | -10 | 10 | -20 | 0 | 5 | 10 | -10 | -5 |
| CYCLE TN | 2500 | 2505 | 2510 | 2515 | 2520 | 2525 | 2520 | 2515 | 2510 | 2505 | 2500 | 2495 | 2490 | 2485 | 2480 | 2475 | 2480 | 2485 | 2490 | 2495 |

CIRCUIT BLOCK DIAGRAM OF A SPREAD SPECTRUM CLOCK GENERATION CIRCUIT ACCORDING TO JAPANESE UNEXAMINED PATENT PUBLICATION NO. 2005-200083

CLOCK GENERATION CIRCUIT AND CLOCK GENERATION METHOD

CROSS-REFERENCE TO RELATED APPLICATIONS

This application is based upon and claims the benefit of priority from the prior Japanese Patent Application No. 2005-268332 filed on Sep. 15, 2005, the entire contents of which are incorporated herein by reference.

BACKGROUND OF THE INVENTION

1. Field of the Invention

The present invention relates to a clock generation circuit. More particularly, the present invention relates to a clock generation circuit and a controlling method thereof, the clock generation circuit performing frequency modulation for spread spectrum by accurately controlling the phase difference between a reference clock signal and an output clock signal.

2. Description of Related Art

In recent years, spread spectrum clock generators (abbreviated as SSCG) capable of reducing EMI (Electromagnetic Interference) noise have been receiving attention. SSCGs have a PLL circuit and perform frequency modulation while locking the frequency of an output clock signal to a reference clock, thereby spreading the frequency spectrum of the output clock signal. Since use of an SSCG enables efficient EMI noise reduction, there have been increasing demands for adapting of an SSCG to systems which heretofore have had difficulties in use of an SSCG.

In Japanese unexamined patent publication No. 2005-020083 shown in FIG. 8, a conventional spread spectrum clock generation circuit equipped with a PLL (Phase Locked Loop) circuit 102 is disclosed. As shown in FIG. 8, the PLL circuit 102 includes (i) a DLL circuit 108 for generating a plurality of delay clock signals having different phases by delaying an oscillation clock signal CLKO100 (hereinafter referred to as "output clock signal") and (ii) a selector 109 for selecting one of the plurality of delay clock signals to output a selected clock signal CLKS100. In the selector 109, frequency modulation for spread spectrum is performed by switching the delay clock signals. The clock signal modulated by the selector 109 is divided in a feedback divider circuit 110 so that a comparison clock signal CLKC100 is generated.

The related art techniques are disclosed in Japanese unexamined patent publications Nos. 2005-4451, H7-202652 and H7-235862.

SUMMARY OF THE INVENTION

In the conventional technique shown in FIG. 8, the selector 109 performs frequency modulation by selectively switching one of a plurality of delay clock signals within one cycle of the oscillation clock signal CLKO100. In this modulation, if the switching is done in a region where a signal level in the vicinity of the rising edge or falling edge of a delay clock signal is unstable, spike noise is generated. If the switching is done with a timing intermediate between the timing of generation of a transition edge of a delay clock signal before switching and the timing of generation of a transition edge of the delay clock signal after switching, these transition edges are output so that a hazard is generated before and after switching. The conventional techniques do not teach any means for preventing such spike noise and hazard generation.

In the conventional technique shown in FIG. 8, as the cycle of the oscillation clock signal CLKO100 becomes shorter, the time margin for stable switching operation becomes smaller. It is a problem that the conventional technique cannot ensure a sufficient time margin for the switching operation particularly for the case where the frequency of the oscillation clock signal CLKO100 is increased in compliance with the recent tendency towards speeding-up of the operation of semiconductor integrated circuits.

The invention is directed to overcoming at least one of the foregoing problems presented by the background art and a primary object of the invention is therefore to provide a clock generation circuit and a clock generation method which are capable of spread spectrum clock generation and accurate phase control of a reference clock signal and an output clock signal.

In accomplishing the above object, there has been provided, in accordance with a first aspect of the invention, a clock generation circuit which receives a reference clock as an input and spreads the spectrum of an output clock according to a modulation signal, the clock generation circuit comprising: at least either a first divider circuit for dividing the reference clock, which has been input, to output a divided reference clock or a second divider circuit for dividing the output clock, which has been input, to output a divided output clock; a first delay circuit for generating a plurality of delay clocks having different phases, for either the divided reference clock or the divided output clock; a selector circuit for selectively outputting, in response to the modulation signal, one of the plurality of delay clocks according to the timing of the reference clock or output clock which corresponds to the delay clocks; and a phase comparator for making a comparison between the phase of the divided reference clock or divided output clock which does not correspond to the delay clocks and the phase of the delay clock selected by the selector circuit to output a signal according to the result of the comparison.

In the clock generation circuit according to the first aspect, at least either division of the reference clock by the first divider circuit or division of the output clock by the second divider circuit is done. After the division, either the divided reference clock or the divided output clock is delayed by the first delay circuit to generate a plurality of delay clocks having different phases. Thus, by performing division prior to delaying, the reference clock can be used in combination with the divided reference clock, or the output clock can be used in combination with the divided output clock.

Now, there will be given an explanation on the case where the delay clocks are generated for the divided reference clock in the first delay circuit. The reference clock and the divided reference clock are coincident to each other in terms of phase, and the cycle of the divided reference clock is greater than that of the reference clock. Therefore, based on the reference clock, a specified time period within the cycle of the divided reference clock can be designated without fail. More specifically, in the selector circuit, a time period during which the signal levels of the divided reference clock signal and the delay clock signal are stable is designated based on the reference clock and the clock selecting operation is performed according to a modulation signal during the designated time period. Thereby, spike noise and hazard generation can be prevented, so that the phase comparator can make an accurate phase comparison with the result that the frequency spectrum of the output clock signal can be spread with high accuracy.

The cycle of the divided reference clock is greater than that of the reference clock. Therefore, larger time regions where the signal level are stable can be obtained in the case where the divided reference clock is delayed by the first delay circuit for the selection to be done by the selector circuit than the case where the reference clock is delayed by the first delay circuit for the selection to be done by the selector circuit. As a result, the object of the first aspect of the invention, that is, an increased margin for the stable operation of the clock generation circuit can be achieved.

A similar operation is performed in the case where the delay clocks are generated for the divided output clock in the first delay circuit.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 7 is a correlation table of a reload value CR, a modulation signal MOD and a cycle TN.

DETAILED DESCRIPTION OF THE PREFERRED EMBODIMENTS

Figure 1:
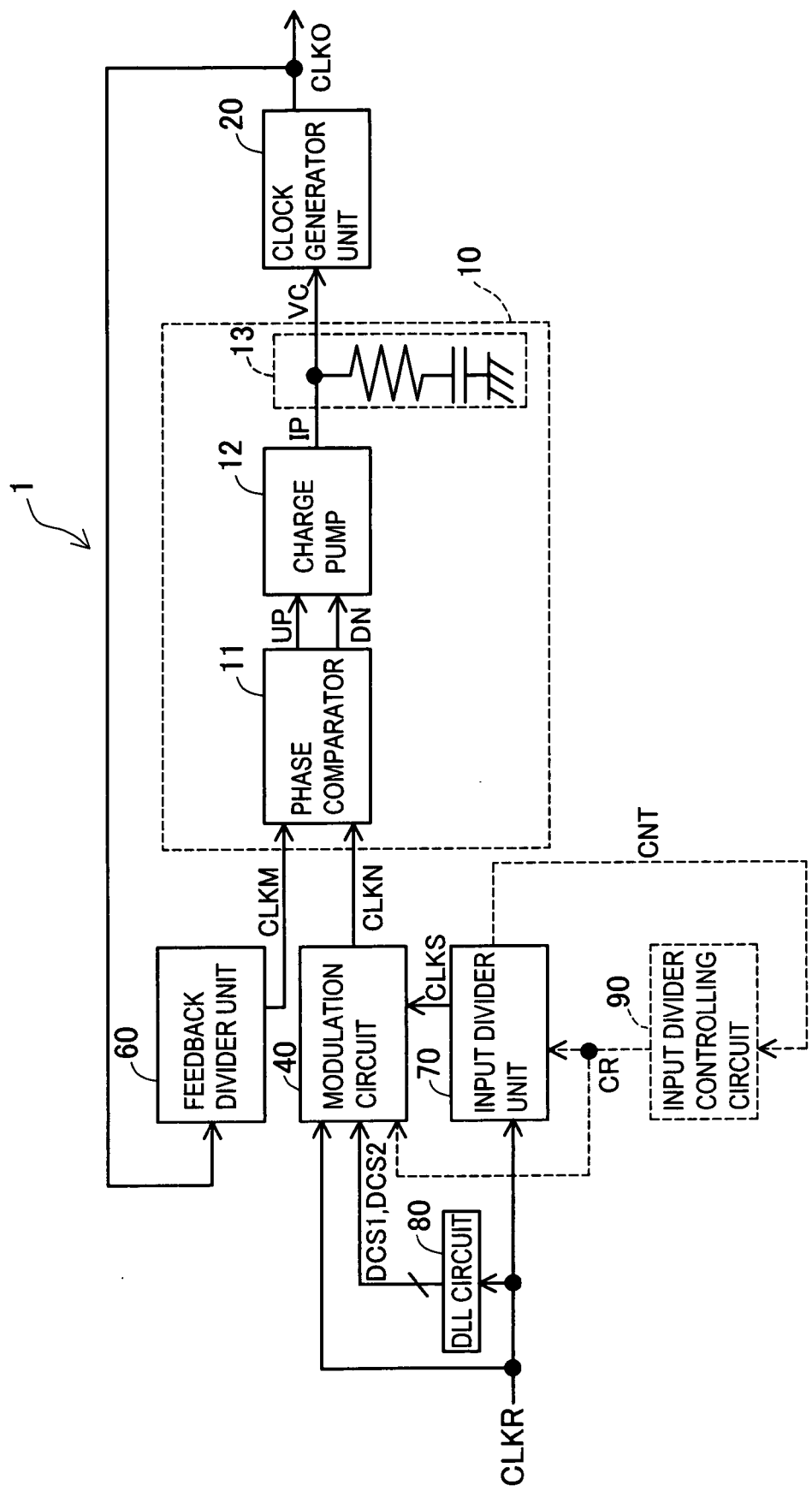
FIG. 1 is a circuit block diagram of a spread spectrum clock generation circuit 1.

Referring now to FIGS. 1 to 6, a first embodiment will be described in detail, which embodies a case where the invention is applied to a semiconductor device. FIG. 1 is a circuit block diagram illustrating a spread spectrum clock generation circuit 1 according to the first embodiment. The spread spectrum clock generation circuit 1 has a phase comparator unit 10, a clock generator unit 20, a modulation circuit 40, a feedback divider unit 60, an input divider unit 70 and a DLL circuit 80. An input clock signal CLKR is a clock signal having a frequency of 25 (MHz) and a cycle T0 of 40 (ns). The input divider unit 70 divides the input clock signal CLKR by 50 to output a divided input clock signal CLKS. The cycle T1 of the divided input clock signal CLKS is 2500 (ns). The feedback divider unit 60 divides an output clock signal CLKO by 50 to output a divided inner clock signal CLKM. The DLL circuit 80 inputs the input clock signal CLKR and outputs a delay control signals DCS1, DCS2. The modulation circuit 40 delays the divided input clock signal CLKS in response to the delay control signals DCS1, DCS2 which have been input. The modulation circuit 40 outputs a modulation clock signal CLKN. Of these units, the phase comparator unit 10, the clock generator unit 20 and the feedback divider unit 60 constitute a PLL (Phase Lock Loop) circuit and performs control such that the phase difference between the modulation clock signal CLKN and the divided inner clock signal CLKM becomes constant.

The phase comparator unit 10 includes a phase comparator 11, a charge pump 12 and a loop filter 13. The phase comparator 11 detects the time difference between the rising edge of the modulation clock signal CLKN and the rising edge of the divided inner clock signal CLKM to output phase difference signals UP, DN each having a pulse width in accordance with the result of the detection. Specifically, if the rising edge of the divided inner clock signal CLKM lags behind the rising edge of the modulation clock signal CLKN, a phase difference signal UP having a pulse width corresponding to the time difference between the rising edges is output. In the reverse case, a phase difference signal DN having a pulse width corresponding to the time difference between the rising edges is output.

The charge pump 12 supplies a positive or negative phase difference current IP to the loop filter 13 in accordance with the phase difference signal UP or DN. Specifically, if the phase difference signal UP is input, a positive current is supplied, and if the phase difference signal DN is input, a negative current is supplied. The loop filter 13 outputs a control voltage VC by integrating the phase difference current IP output from the charge pump 12. The clock generator unit 20 generates the output clock signal CLKO having a frequency corresponding to the control voltage VC from the loop filter 13.

Figure 2:
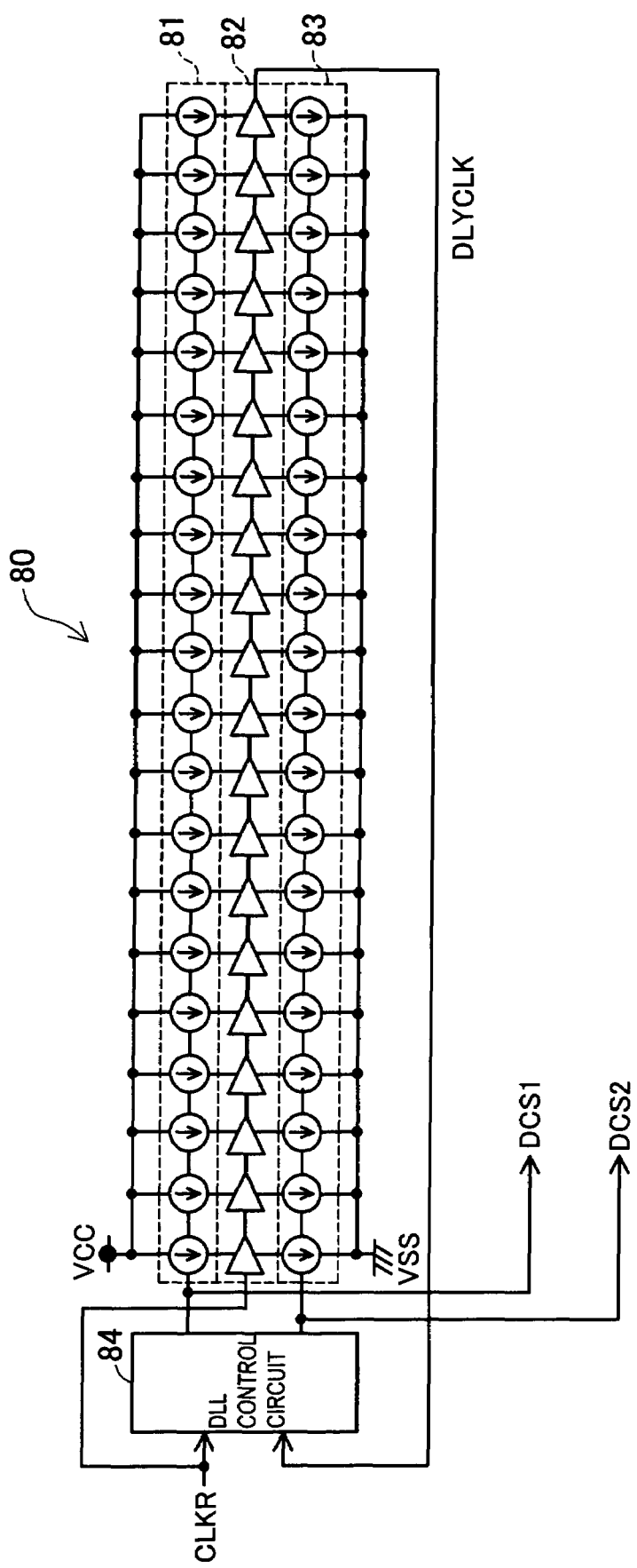
FIG. 2 is a circuit diagram of a DLL circuit 80.

FIG. 2 shows a circuit diagram of the DLL circuit 80. The DLL circuit 80 includes a first current source unit 81, a second current source unit 83, a delay circuit 82 and a DLL control circuit 84. The first current source unit 81 and the second current source unit 83 each have twenty current sources. The delay circuit 82 has twenty buffers which are connected in series. The current sources of the first current source unit 81 are connected to the power source terminals of the buffers, respectively, of the delay circuit 82. The current sources of the second current source unit 83 are connected to the earth terminals of the buffers, respectively, of the delay circuit 82. The first current source unit 81 is connected to a power source potential VCC, whereas the second current source unit 83 is connected to a ground potential VSS. Input to the DLL control circuit 84 are the input clock signal CLKR and a delay clock signal DLYCLK which is output from the buffer of the last stage of the delay circuit 82. The DLL control circuit 84 outputs the delay control signals DCS1, DCS2 which are in turn input to the first current source 81 and the second current source 83, respectively. A delay time is determined for each of the buffers of the delay circuit 82 according to its associated first and second current source units 81, 83.

Figure 3:
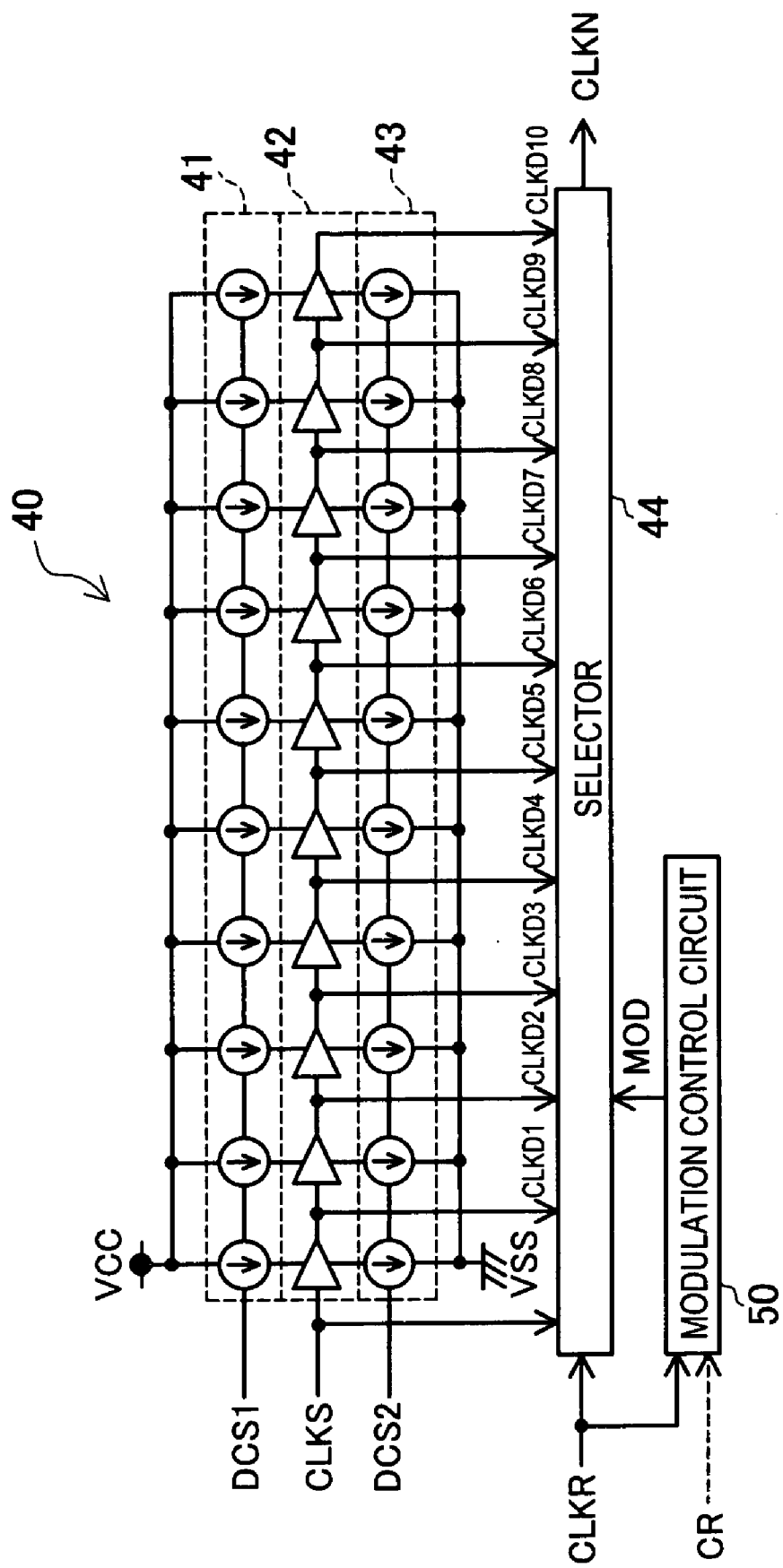
FIG. 3 is a circuit diagram of a modulation circuit 40.

FIG. 3 shows a circuit diagram of the modulation circuit 40. The modulation circuit 40 includes a first current source unit 41, a second current source unit 43, a delay circuit 42, a selector 44 and a modulation control circuit 50. The first current source unit 41 and the second current source unit 43 each have ten current sources. The delay circuit 42 has ten buffers which are connected in series. The current sources of the first current source unit 41 are connected to the power source terminals of the buffers, respectively, of the delay circuit 42. The current sources of the second current source unit 43 are connected to the earth terminals of the buffers, respectively, of the delay circuit 42. The first current source unit 41 is connected to the power source potential VCC, whereas the second current source unit 43 is connected to the ground potential VSS. The delay control signals DCS1, DCS2 are input to the first current source unit 41 and the second current source unit 43, respectively. The divided input clock signal CLKS is input to the buffer of the first stage of the delay circuit 42. The elements constituting the first current source unit 41, second current source unit 43 and delay circuit 42 of the modulation circuit 40 have the same device configuration as those of the first current source unit 81, second current source unit 83 and delay circuit 82 of the DLL circuit 80.

Input to the selector 44 and the modulation control circuit 50 is the input clock signal CLKR. A modulation signal MOD output from the modulation control circuit 50 is input to the selector 44. A delay time is determined for each of the buffers of the delay circuit 42 according to the delay control signals DSC1, DCS2 to delay the divided input clock signal CLKS. Delay clock signals CLKD1 to CLKD10 are output from the output nodes of the buffers to be input to the selector 44. The divided input clock signal CLKS is input to the selector 44. The selector 44 outputs the modulation clock signal CLKN.

Next, reference will be made to FIGS. 4 to 6 to describe the operation of the spread spectrum clock generation circuit 1. The operation of the DLL circuit 80 will be explained. The delay circuit 82 delays the input clock signal CLKR and outputs the delay clock signal DLYCLK from the buffer of the last stage. The DLL control circuit 84 compares the phase of the input clock signal CLKR with the phase of the delay clock signal DLYCLK and controls the current values of the first current source unit 81 and the second current source unit 83 so as to make the phase difference between them equal to one cycle T0 (40 (ns)) of the input clock signal CLKR. That is, the DLL circuit 80 operates to make an adjustment so as to delay the phase of the delay clock signal DLYCLK from the input clock signal CLKR by one cycle T0. Thereby, the delay time for the buffer in each stage of the delay circuit 82 is made equal to the value obtained by dividing the cycle T0 by the number of buffer stages. In this case, the delay time per buffer stage is defined as a reference delay time tr. In the first embodiment, since the cycle T0=40 (ns) and the number of buffers of the delay circuit 82 is 20, the reference delay time tr is 2 (ns).

Next, the operation of the modulation circuit 40 will be explained. As bias signals for the first current source unit 41 and second current source unit 43 of the modulation circuit 40, the delay control signals DCS1, DCS2 are input. The signal level of the delay control signals DCS1, DCS2 is equal to the level value when the delay time per buffer stage of the delay circuit 82 of the DLL circuit 80 becomes equal to the reference delay time tr. As described earlier, the elements constituting the DLL circuit 80 and the elements constituting the modulation circuit 40 have the same device configuration. Therefore, the delay time for each buffer stage of the delay circuit 42 of the modulation circuit 40 is also equal to the reference delay time tr.

More specifically, the DLL circuit 80 operates to obtain the delay control signals DCS1, DCS2 which allow the delay time per buffer stage to be equal to the reference delay time tr. The modulation circuit 40 operates to generate delay clock signals CLKD1 to CLKD10 by delaying the divided input clock signal CLKS stepwise by the reference delay time tr based on the delay control signals DCS1, DCS2.

Figure 4:
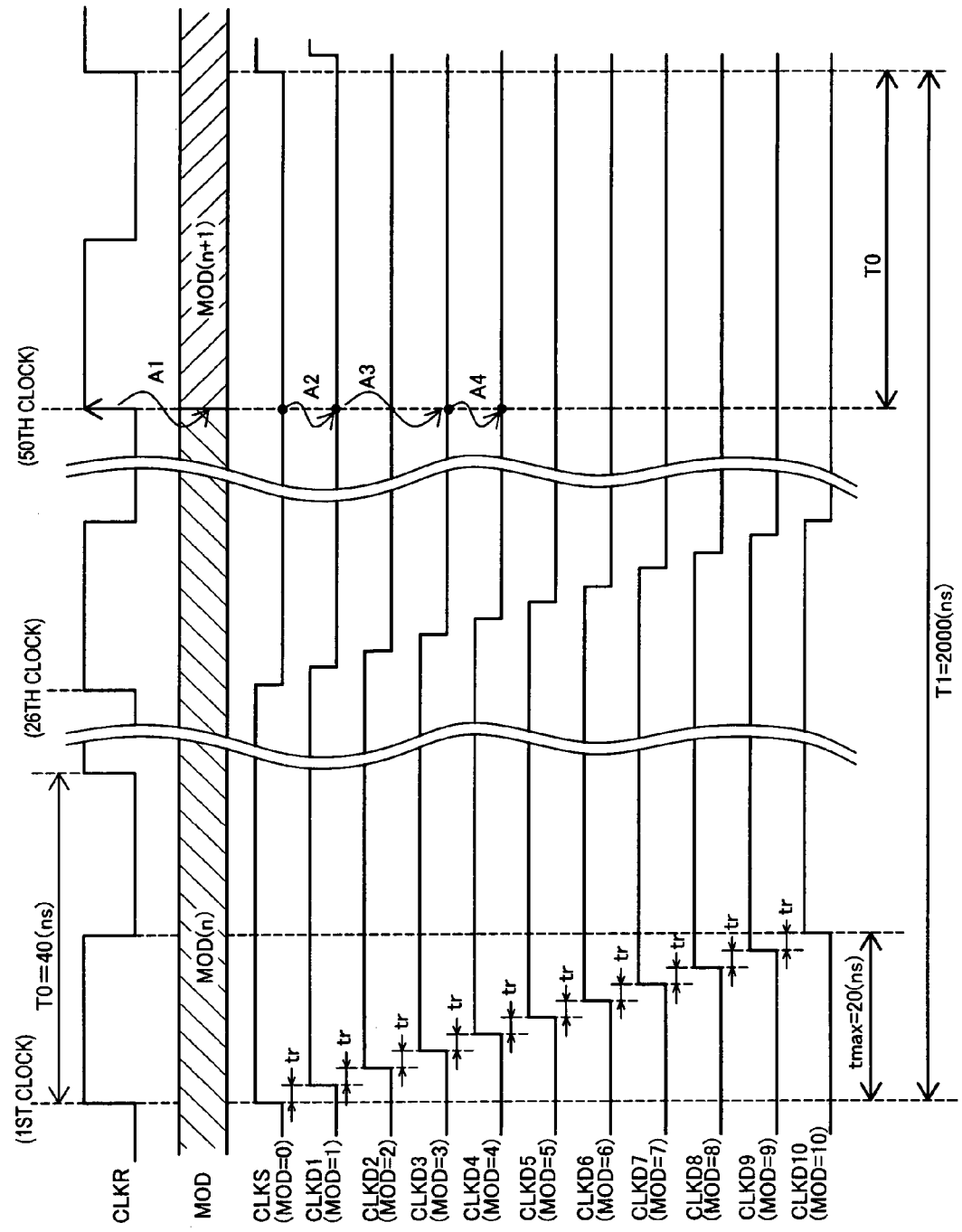
FIG. 4 is a time chart of the modulation circuit 40.

FIG. 4 is a time chart for explaining the operation of the modulation circuit 40 shown in FIG. 3. In FIG. 4, the delay clock signals CLKD1 to CLKD10 are signals output from the delay circuit 42. The delay clock signal CLKD1 output from the buffer of the first stage of the delay circuit 42 has a waveform the phase of which is delayed from the divided input clock signal CLKS by the reference delay time tr (2 (ns)). The delay clock signal CLKD2 output from the buffer of the next stage has a waveform the phase of which is further delayed from the delay clock signal CLKD1 by the reference delay time tr. Likewise, the phase of each of the delay clock signals DLYCLK3 to DLYCLK10 is delayed from its preceding delay clock signal by the reference delay time tr. Accordingly, the delay clock signal CLKD10 has a waveform the phase of which is delayed from the divided input clock signal CLKS by 20 (ns).

The modulation control circuit 50 outputs the modulation signal MOD. The modulation signal MOD takes a value ranging from 0 to 10. According to the value of the modulation signal MOD, the selector 44 selects one of the waveforms of the divided input clock signal CLKS and the delay clock signals CLKD1 to CLKD10. If the modulation signal MOD=0, the selector 44 outputs the divided input clock signal CLKS. If the modulation signal MOD=1, the selector 44 outputs the delay clock signal CLKD1. If the modulation signal MOD=2 to 10, the selector 44 outputs the delay clock signals CLKD2 to CLKD10.

The phase of the clock waveform selected by the selector 44 is varied on the cycle T1 by switching the modulation signal MOD on the cycle T1. In this way, the modulation of the divided input clock signal CLKS is performed.

Referring to FIG. 4, there is a likelihood that spike noise or hazards may occur, if selective switching of clock waveform is done in one of regions where the signal levels of the divided input clock signal CLKS and the delayed clock signals CLKD1 to CLKD10 are unstable in the vicinity of their rising edges and falling edges. Therefore, it is necessary to perform switching in good time during which the signal levels of the divided input clock signal CLKS and the delay clock signals CLKD1 to CLKD10 are stable.

This embodiment uses two clock signals, i.e, the input clock signal CLKR for setting a timing of switching and the divided input clock signal CLKS which is the object of modulation. Since the divided input clock signal CLKS is obtained by dividing the input clock signal CLKR, the phases of these clock signals are coincident. Therefore, use of the input clock signal CLKR makes it possible to designate a certain time period in the cycle T1 of the divided input clock signal CLKS without fail. By designating the time period beforehand using the input clock signal CLKR, in which time period, the signal levels of the divided input clock signal CLKS and the delay clock signals CLKD1 to CLKD10 are stable, the switching operation can be performed while preventing generation of spike noise and hazards.

More concretely, the switching operation should be performed in other time regions than the time regions where the signal levels of the divided input clock signal CLKS and the delay clock signals CLKD1 to CLKD10 are unstable and which exist before and after the rising edges and falling edges of these clock signals. The time width of the time regions where the signal levels are unstable is equal to the value obtained by adding the time required for the switching operation of the selector 44 to the maximum delay time $t_{max}$ (20 ns). In FIG. 4 for instance, switching of a clock waveform can be performed in other time regions than the time regions where the signal levels are unstable, by switching the modulation signal MOD (arrow A1), using the rising edge of the 50th clock of the input clock signal CLKR as a trigger.

There will be made a detailed explanation on the operation of the modulation circuit 40 when the cycle T1 of the divided input clock signal CLKS is modulated to 2000±4 (ns) every 2 (ns). In this case, the modulation control circuit 50 has Steps S1 to S8 and the modulation signal MOD is switched for every cycle T1 (2000 (ns)). At Steps S1 to S4, the value of the modulation signal MOD is switched to 0, 1, 3, and 4 in this order (in ascending order). At Steps S5 to S8, the value of the modulation signal MOD is switched to 4, 3, 1 and 0 in this order (in descending order).

Figure 5:
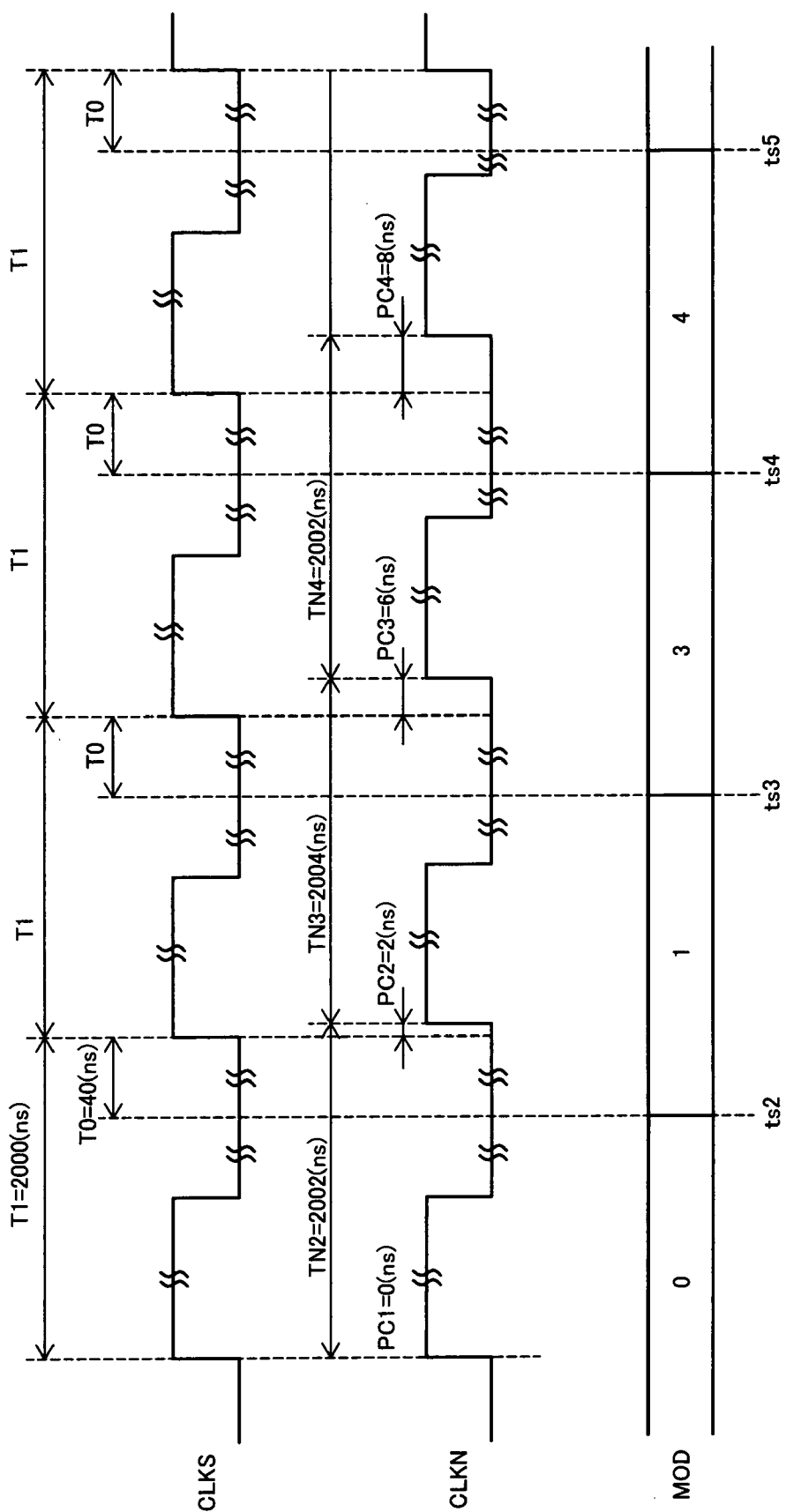
FIG. 5 is a waveform chart of Steps S1 to S4.

FIG. 5 is a waveform chart showing the relationship between the divided input clock signal CLKS and the modulation clock signal CLKN at Steps S1 to S4. Firstly, at Step S1, the value of the modulation signal MOD is 0. As mentioned earlier, if the modulation signal MOD=0, the selector 44 outputs the divided input clock signal CLKS as the modulation clock signal CLKN. Therefore, the phase difference PC1 between the divided input clock signal CLKS and the modulation clock signal CLKN is 0.

Then, operation proceeds to Step S2 at time ts2 and the modulation signal MOD is switched from 0 to 1. Therefore, the output of the selector 44 is switched from the divided input clock signal CLKS to the delay clock signal CLKD1 (FIG. 4, arrow A2). As a result, the delay clock signal CLKD1 is output as the modulation clock signal CLKN. Therefore, the phase difference PC2 between the divided input clock signal CLKS and the modulation clock signal CLKN becomes 2 (ns). Then, the modulation width (the amount of increase/decrease from the cycle T1) of the modulation clock signal CLKN at Step S2 becomes +2 (ns) that is the difference between the phase difference PC2 (=2 (ns)) at Step S2 and the phase difference PC1 (=0 (ns)) at the preceding step, i.e., Step S1. Consequently, the frequency TN2 of the modulation clock signal CLKN at Step S2 is 2002 (ns).

Then, operation proceeds to Step S3 at time ts3 and the modulation signal MOD is switched from 1 to 3. Therefore, the output of the selector 44 is switched from the delay clock signal CLKD1 to the delay clock signal CLKD3 (FIG. 4, arrow A3). As a result, the delay clock signal CLKD3 is output as the modulation clock signal CLKN. Therefore, the phase difference PC3 between the divided input clock signal CLKS and the modulation clock signal CLKN becomes 6 (ns). Then, the modulation width of the modulation clock signal CLKN at Step S3 becomes +4 (ns) that is the difference between the phase difference PC3 (=6 (ns)) and the phase difference PC2 (=2 (ns)). Consequently, the cycle TN3 of the modulation clock signal CLKN at Step S3 becomes 2004 (ns).

Likewise, operation proceeds to Step S4 at time ts4, and the modulation signal MOD is switched from 3 to 4. Therefore, the output of the selector 44 is switched from the delay clock signal CLKD3 to the delay clock signal CLKD4 (FIG. 4, arrow A4). Then, the modulation width at Step S4 becomes +2 (ns) that is the difference between the phase difference PC4 (=8 (ns)) at Step S4 and the phase difference PC3 (=6 (ns)) at Step S3. Consequently, the cycle TN4 of the modulation clock signal CLKN at Step S4 becomes 2002 (ns).

Figure 6:
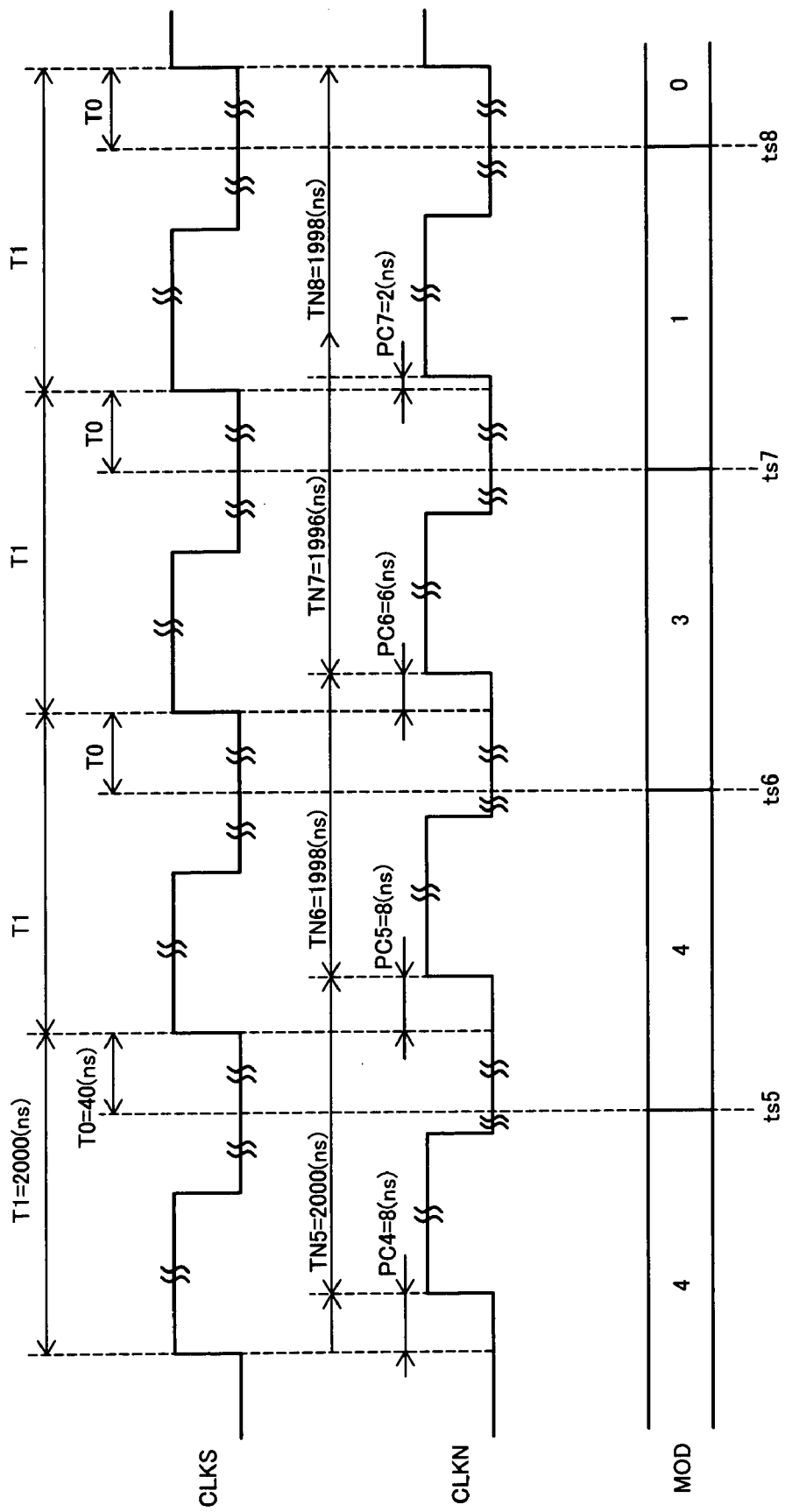
FIG. 6 is a waveform chart of Steps S5 to S8.
Figure 8:
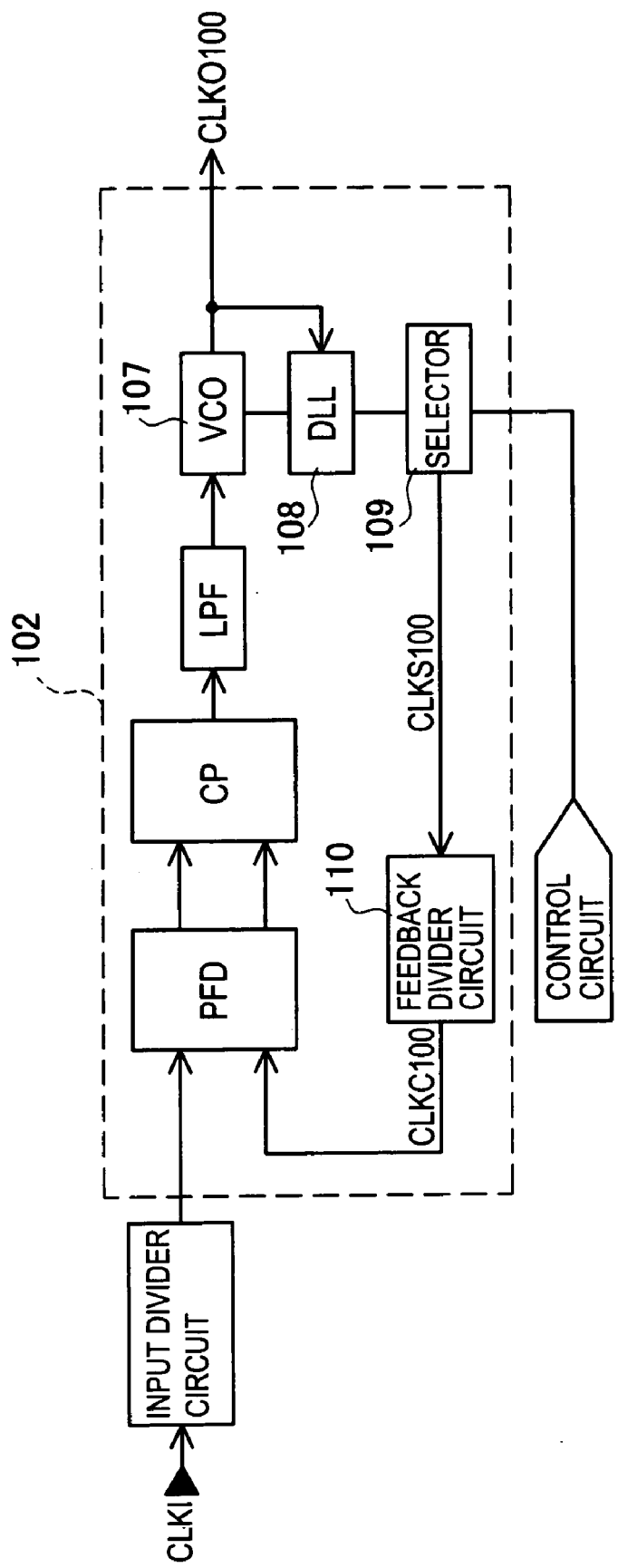
FIG. 8 is a circuit block diagram of a spread spectrum clock generation circuit according to Japanese unexamined patent publication No. 2005-200083.

FIG. 6 is a waveform chart showing the relationship between the divided input clock signal CLKS and the modulation clock signal CLKN at Steps S5 to S8. Operation proceeds to Step S5 at time ts5. At that time, the modulation MOD=4 is maintained and the output of the selector 44 is kept equal to the delay clock signal CLKD4. Then, the modulation width at Step S5 becomes 0 (ns) that is the difference between the phase difference PC5 (=8 (ns)) at Step S5 and the phase difference PC4 (=8 (ns)) at Step S4, and therefore the cycle TN5 of the modulation clock signal CLKN at Step S5 becomes 2000 (ns).

Operation proceeds to Step S6 at time ts6 with the modulation signal MOD being switched from 4 to 3, and then the output of the selector 44 is switched from the delay clock signal CLKD4 to the delay clock signal CLKD3. Then, the modulation width at Step S6 becomes −2 (ns) that is the difference between the phase difference PC6 (=6 (ns)) at Step S6 and the phase difference PC5 (=8 (ns)) at Step S5. Therefore, the cycle TN6 at Step S6 becomes 1998 (ns).

Likewise, operation proceeds to Step S7 at time ts7 with the modulation signal MOD being switched from 3 to 1, and then the output of the selector 44 is switched from the delay clock signal CLKD3 to the delay clock signal CLKD1. Then, the modulation width at Step S7 becomes −4 (ns) that is the difference between the phase difference PC7 (=2 (ns)) and the phase difference PC6 (=6 (ns)). Therefore, the cycle TN7 at Step S7 becomes 1996 (ns). Operation proceeds to Step S8 at time ts8 with the modulation signal MOD being switched from 1 to 0, and then the output of the selector 44 is switched from the delay clock signal CLKD1 to the divided input clock signal CLKS. Then, the modulation width at Step S8 becomes −2 (ns), and therefore, the cycle TN8 at Step S8 becomes 1998 (ns).

Thereby, at Steps S1 to S8, the cycle TN of the modulation clock signal CLKN can be switched to 2002, 2004, 2002, 2000, 1998, 1996, 1998, 2000 (ns). Specifically, the cycle of the modulation clock signal CLKN is modulated to 2000±4 (ns) so that a modulation clock of 25 (MHz)±0.2 (%) can be obtained.

As described hereinabove, in the spread spectrum clock generation circuit 1 according to the first embodiment, after dividing the input clock signal CLKR in the input divider unit 70, the divided input clock signal CLKS obtained by division is modulated in the modulation circuit 40. Division is thus firstly performed thereby generating two clock signals, i.e., the input clock signal CLKR for setting a switching timing for the selector 44 and the divided input clock signal CLKS that is the object of modulation. It should be noted that since the input clock signal CLKR is divided thereby obtaining the divided input clock signal CLKS, the phases of these clock signals are coincident. Next, the divided input clock signal CLKS obtained through division is delayed, thereby generating the delay clock signals CLKD1 to CLKD10. Then, the time regions, where the signal levels of the divided input clock signal CLKS and the delay clock signals CLKD1 to CLKD10 are stable, are designated by use of the input clock signal CLKR based on which the division has been performed, and the switching operation of the selector 44 is performed in these time regions. Thereby, generation of spike noise and hazards can be prevented so that the frequency spectrum of the output clock signal can be accurately spread.

The cycle T1 of the divided input clock signal CLKS after division is greater than the cycle T0 of the input clock signal CLKR before division. Therefore, larger time regions where the signal levels are stable can be ensured for the switching operation of the selector 44 in the case where the divided input clock signal CLKS is modulated, compared to the case where the input clock signal CLKR is modulated. As a result, the stable operation margin for the spread spectrum clock generation circuit 1 can be increased. This arrangement has the advantage of assuring a stable operation margin particularly for the case where the frequency of the input clock signal CLKR is increased in compliance with the recent tendency towards speeding-up of the operation of semiconductor integrated circuits.

In the spread spectrum clock generation circuit 1 of the first embodiment, the delay elements of the delay circuit 82 of the DLL circuit 80 and the delay elements of the delay circuit 42 of the modulation circuit 40 have the same device configuration. Therefore, the DLL circuit 80 operates to obtain the delay control signals DCS1, DCS2 for causing the delay time per delay element to be equal to the reference delay time tr, and the modulation circuit 40 operates to generate the delay clock signals CLKD1 to CLKD10 by delaying the divided input clock signal CLKS stepwise by reference delay time tr based on the delay control signals DCS1, DCS2. Thereby, the modulation depth of the output clock signal CLKO can be more accurately controlled. Since the delay elements of the delay circuits 82 and the delay elements of the delay circuits 42 have the same device configuration, the correlation between the modulation circuit 40 and the DLL circuit 80 can be kept constant even if the circumstances such as phase difference signals, ambient temperature and processing conditions vary.

There will be explained a spread spectrum clock generation circuit according to a second embodiment of the invention. The spread spectrum clock generation circuit of the second embodiment includes an input divider controlling circuit 90 in addition to the spread spectrum clock generation circuit 1 shown in FIG. 1. Input to the input divider controlling circuit 90 is a count value CNT of a division counter provided for the input divider unit 70. A reload value CR of the division counter provided for the input divider unit 70 is output from the input divider controlling circuit 90 and input to the input divider unit 70 and the modulation control circuit 50 (FIG. 3) of the modulation circuit 40. The spread spectrum clock generation circuit of the second embodiment is the same as the spread spectrum clock generation circuit 1 of the first embodiment except the above points, a detailed description of it is skipped herein.

The operation will be described. Suppose that the frequency of the input clock signal CLKR is 40 (MHz) and the cycle T0 is 25 (ns) and that the initial value for the reload value CR of the division counter of the input divider unit 70 is 100 and the count set value of the division counter of the feedback divider unit 60 is 100. In this case, since the input divider unit 70 divides the input clock signal CLKR by 100, the cycle T1 of the divider input clock signal CLKS is 2500 (ns). The amount of change in the cycle T1 per the amount of change '1' in the reload value CR is 25 (ns). The feedback divider unit 60 divides the output clock signal CLKO by 100.

There will be explained a case where the cycle T1 of the divided input clock signal CLKS is modulated to 2500±25 (ns) every 5 (ns). The number of buffer circuits of the delay circuit 82 provided for the DLL circuit 80 is five and the reference delay time tr is set to 5 (ns). The four buffers are provided for the delay circuit 42 of the modulation circuit 40. The number of buffers for the delay circuit 42 is smaller than the value obtained by dividing the cycle T0 (25 (ns)) by the reference delay time tr (5 (ns)). The delay circuit 42 outputs the delay clock signals CLKD1 to CLKD4.

The modulation control circuit 50 (FIG. 3) has Steps S1 to S20 and the cycle T1 (2500 (ns)) is switched by the modulation signal MOD. The input divider controlling unit 90 also has Steps S1 to S20 and the reload value CR is switched by the cycle T1. Since the method for determining the switching timing of the modulation signal MOD and the reload value CR is the same as that of the first embodiment, a detailed explanation of it is skipped herein.

FIG. 7 shows the relationship between the reload value CR, the modulation signal MOD and the cycle TN of the modulation clock signal CLKN at Steps S1 to S20. At Steps S1 to S3, the reload value CR=100 and the cycle T1 of the divided input clock signal CLKS is 2500 (ns). As the modulation signal MOD is switched to 0, 1, 3 in this order, using the rising edge of, for instance, the 100th clock of the input clock signal CLKR as a trigger, the selector 44 sequentially selects the divided input clock signal CLKS, the delay clock signal CLKD1 and the delay clock signal CLKD3. Therefore, the modulation width MW of the modulation clock signal CLKN is sequentially changed to 0, +5, +10 (ns), so that the cycle TN of the modulation clock signal CLKN is sequentially changed to 2500, 2505, 2510 (ns)

After completion of Step S3, operation proceeds to Step S4. The input divider controlling unit 90 detects the transition to Step S4 by monitoring the count value CNT and switches the reload value CR from 100 to 101. During Steps S4 to S6, the reload value CR=101 is maintained. Since the input divider unit 70 divides the input clock signal CLKR by 101, the cycle T1 of the divided input clock signal CLKS is 2525 (ns). The modulation control circuit 50 monitors the reload value CR and detects that the cycle T1 changes to 2525 (ns). The modulation control circuit 50 can invariably switch the modulation signal MOD at the rising edge of the 100th clock of the input clock signal CLKR, even if the cycle T1 is altered. When the modulation signal MOD is switched to 1, 0, 0 in this order, the modulation width MW of the modulation clock signal CLKN becomes −10, −5, 0 (ns). Therefore, the cycle TN of the modulation clock signal CLKN becomes 2515, 2520, 2525 (ns).

As shown in FIG. 7, the reload value CR and the modulation signal MOD are switched similarly at Steps S7 to S20. Thereby, the cycle TN of the modulation clock signal CLKN can be reduced, at Steps S6 to S16, from 2525 (ns) to 2475 (ns) by 5 (ns) at a time. And, the cycle TN of the modulation clock signal CLKN can be increased, at Steps S16 to S20, from 2475 (ns) to 2495 (ns) by 5 (ns) at a time. As a result, modulation of ±1.0 (%) can be performed on the divided input clock signal CLKS.

As fully described hereinabove, the spread spectrum clock generation circuit according to the second embodiment uses, for modulating the divided input clock signal CLKS, the first means for directly changing the cycle T1 of the divided input clock signal CLKS by changing the reload value CR of the input divider unit 70 and the second means for changing the cycle by sequentially selecting the delay clock signals CLKD1 to CLKD4 which are delayed from the divided input clock signal CLKS.

The minimum time of the modulation width obtained by the first means is equal to the cycle T0 (25 (ns)) of the input clock signal CLKR and therefore is sufficiently greater compared to the reference delay time tr=5 (ns) that is the minimum time of the modulation width obtained by the second means. Therefore, the modulation width can be arbitrarily set in increments of 5 (ns) through coarse adjustment of the modulation width in increments of 25 (ns) with the first means and fine adjustment of it in increments of 5 (ns) with the second means. Accordingly, the range of the modulation width obtained by the second means is 25 (ns) and therefore the number of buffers required for the delay circuit 42 is four. Thanks to this, not only can the circuit scale of the delay circuit 42 be restricted but also the cycle of the divided input clock signal CLKS can be modulated with fine modulation width and high modulation depth. The number of buffers provided for the delay circuit 42 may be smaller than the value obtained by dividing the cycle T0 (25 (ns)) by the reference delay time tr (5 (ns)). Preferably, the number of buffers may be the value obtained by subtracting 1 from the value obtained by dividing the cycle T0 by the reference delay time tr (the number of buffers=4 in this embodiment). Thereby, the modulation width of the first means can be finely uniformly adjusted by the second means, so that the frequency spectrum of the output clock signal can be more accurately spread.

It is apparent that the invention is not necessarily limited to the particular embodiments shown herein and various changes and modifications may be made to the disclosed embodiments without departing from the spirit and scope of the invention. While the modulation control circuit 50 performs Steps S1 to S8 in the first embodiment, the invention is not necessarily limited to this. The steps performed by the modulation control circuit 50 vary depending on the modulation width of the cycle T1 of the divided input clock signal CLKS and the reference delay time tr. For instance, if the modulation width is ±6 (ns) and the reference delay time tr is 2 (ns) on the condition that the cycle T1 is 2000 (ns), Steps S1 to S12 are required. By changing the modulation signal MOD to 0, 1, 3, 6, 8, 9, 9, 8, 6, 3, 1, 0, the cycle TN of the modulation clock signal CLKN can be switched to 2002, 2004, 2006, 2004, 2002, 2000, 1998, 1996, 1994, 1996, 1998, 2000 (ns). This makes it possible to obtain the modulation clock signal CLKN which has been modified to 25 (MHz)±0.3 (%).

While the modulation circuit 40 is located in the path between the input divider unit 70 and the phase comparator 11 in the first and second embodiments, the invention is not limited to this. The modulation circuit 40 may be disposed in the path between the feedback divider unit 60 and the phase comparator 11. This enables the divided inner clock signal CLKM obtained by dividing the output clock signal CLKO to be modulated in the modulation circuit 40. Accordingly, the switching operation by the selector 44 can be performed using the output clock signal CLKO in the time regions where the signal levels of the divided inner clock signal CLKM and the delay clock signals CLKD1 to CLKD10 are stable, so that generation of spike noise and hazards can be prevented.

Although the input clock signal CLKR is input to the DLL circuit 80 in the first and second embodiments, the invention is not limited to this. What is input to the DLL circuit 80 may be the output clock signal CLKO. This enables it to determine the reference delay time tr by use of the output clock signal CLKO. Although the output clock signal CLKO is subjected to spectrum spreading, it does not cause a problem when the reference delay time tr is determined, because the modulation depth of the cycle of the output clock signal CLKO is usually small in value, say, several % or less. It is obvious that the modulation circuit 40 may be disposed in the path between the feedback divider unit 60 and the phase comparator 11 and that the output clock signal CLKO may be input to the DLL circuit 80.

While the first and second embodiments include the DLL circuit 80, the invention is not necessarily limited to this and the DLL circuit 80 may be excluded. In this case however, the delay time per buffer cannot be accurately made coincident with the reference delay time tr in the delay circuit 42 of the modulation circuit 40. In cases where there is no need to accurately control the modulation depth of the divided input clock signal CLKS, exclusion of the DLL circuit 80 beneficially leads to a reduction in the size of the circuit.

It should be noted that the input divider unit 70 is one example of the first divider circuit; the feedback divider unit 60 is one example of the second divider circuit; the input clock signal CLKR is one example of the reference clock; the output clock signal CLKO is one example of the output clock; the divided input clock signal CLKS is one example of the divided reference clock; the divided inner clock signal CLKM is one example of the divided output clock; the modulation signal MOD is one example of the modulation signal; the reference delay time tr is one example of the unit delay time; the delay circuit 42 is one example of the first delay circuit; the DLL circuit 80 is one example of the second delay circuit; and the selector 44 is one example of the selector circuit.

By applying the invention, it becomes possible to provide a clock generation circuit and a clock generation method which are capable of generating a spread spectrum clock and controlling the phases of a reference clock signal and an output clock signal with high accuracy.

What is claimed is:

1. A clock generation circuit which receives a reference clock as an input and spreads a spectrum of an output clock according to a modulation signal, the clock generation circuit comprising:
   a divider circuit for receiving either the reference clock or the output clock as a first clock, dividing the first clock, and outputting the first clock, which has been divided, as a divided first clock;
   a first delay circuit for generating a plurality of delay divided first clocks having different phases, for the divided first clock;
   a selector circuit for selectively outputting, in response to the modulation signal, one of the plurality of delay divided first clocks according to timing of an edge of the first clock present during time other than a period which is from an edge of the divided first clock to an edge of the delay divided first clock of which delay time is maximum; and
   a phase comparator for making a comparison between a phase of the one of the reference clock and the output clock not received by the divider circuit as the first clock and a phase of the delay divided first clock selected by the selector circuit and outputting a signal according to a result of the comparison.

2. The clock generation circuit according to claim 1, wherein the first delay circuit has a plurality of unit delay elements which are connected in series, and
   wherein the unit delay elements output the delay divided first clocks, respectively.

3. The clock generation circuit according to claim 2, comprising:
   a second delay circuit which has elements having the same device configuration as of the first delay circuit and is provided for controlling bias signals for the plurality of unit delay elements such that the phase difference between a clock input to a first stage of the unit delay elements and a clock output from a last stage of the unit delay elements becomes equal to one cycle of clocks input to the first stage of the unit delay elements and for outputting said bias signals to the first delay circuit.

4. The clock generation circuit according to claim 3, wherein the clock input to the first stage of the unit delay elements is the reference clock or the output clock.

5. The clock generation circuit according to claim 1, wherein a cycle of the divided first clock is variably controlled according to the modulation signal.

6. The clock generation circuit according to claim 2,
   wherein a cycle of the divided first clock is variably controlled according to the modulation signal, and
   wherein the number of unit delay elements provided for the first delay circuit is smaller than a value obtained by dividing the cycle of the reference clock or the output clock by the delay time of the unit delay elements.

7. A clock generation method for receiving a reference clock as an input and spreading a spectrum of an output clock according to a modulation signal, the clock generation method comprising the steps of:

receiving either the reference clock or the output clock as a first clock, dividing the first clock, and outputting the first clock, which has been divided, as a divided first clock;

generating a plurality of delay divided first clocks having different phases, for the divided first clock;

selectively outputting, in response to the modulation signal, one of the plurality of delay divided first clocks according to timing of an edge of the first clock present during time other than a period which is from an edge of the divided first clock to an edge of the delay divided first clock of which delay time is maximum; and making a comparison between a phase of the one of the reference clock and the output clock not outputted as the first clock and a the phase of the selected delay divided first clock to output a signal according to the a result of the comparison.

8. The clock generation method according to claim 7, wherein the divided value of the reference clock or output clock is variably controlled according to the modulation signal.

* * * * *